(12) United States Patent
Aoki

(10) Patent No.: US 11,923,229 B2
(45) Date of Patent: Mar. 5, 2024

(54) PLASMA PROCESSING METHOD AND PLASMA PROCESSING APPARATUS

(71) Applicant: TOKYO ELECTRON LIMITED, Tokyo (JP)

(72) Inventor: Yusuke Aoki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 145 days.

(21) Appl. No.: 17/513,425

(22) Filed: Oct. 28, 2021

(65) Prior Publication Data

US 2022/0139752 A1 May 5, 2022

(30) Foreign Application Priority Data

Oct. 29, 2020 (JP) .................................. 2020-181798

(51) Int. Cl.
*H01L 21/683* (2006.01)
*H01J 37/32* (2006.01)

(52) U.S. Cl.
CPC .... *H01L 21/6833* (2013.01); *H01J 37/32183* (2013.01); *H01J 37/32449* (2013.01)

(58) Field of Classification Search
CPC ............ H01L 21/6833; H01J 37/32183; H01J 37/32449
USPC .......................................................... 361/234
See application file for complete search history.

(56) References Cited

U.S. PATENT DOCUMENTS

2017/0194157 A1* 7/2017 Ishiguro ............ H01J 37/32715
2019/0066982 A1* 2/2019 Sato .................. H01L 21/67253

FOREIGN PATENT DOCUMENTS

JP         2004047511 A        2/2004

* cited by examiner

*Primary Examiner* — Kevin J Comber
(74) *Attorney, Agent, or Firm* — XSENSUS LLP

(57) ABSTRACT

A plasma processing method includes supplying a voltage to an electrode provided in an electrostatic chuck, thereby adsorbing a substrate onto an upper surface of the electrostatic chuck; after the voltage supplied to the electrode of the electrostatic chuck is stabilized, cutting off the supply of the voltage to the electrode, thereby bringing the electrode into a floating state; and after the voltage supplied to the electrode of the electrostatic chuck is stabilized, performing a predetermined processing with plasma on a surface of the substrate adsorbed onto the electrostatic chuck.

8 Claims, 7 Drawing Sheets

PLASMA PROCESSING METHOD AND PLASMA PROCESSING APPARATUS

CROSS-REFERENCE TO RELATED APPLICATIONS

This application is based on and claims priority from Japanese Patent Application No. 2020-181798, filed on Oct. 29, 2020, with the Japan Patent Office, the disclosure of which is incorporated herein in its entirety by reference.

TECHNICAL FIELD

The present disclosure relates to a plasma processing method and a plasma processing apparatus.

BACKGROUND

Japanese Patent Laid-Open Publication No. 2004-047511 discloses a technique of applying a charge removing voltage to a chuck electrode when a residual charge of a wafer adsorbed to an electrostatic chuck is removed using plasma of an inert gas, in order to rapidly release the material adsorbed onto the electrostatic chuck. The charge removing voltage corresponds to a self-bias potential of the wafer when plasma is applied.

SUMMARY

According to an aspect of the present disclosure, a plasma processing method includes steps (a), (b), and (c). In step (a), a voltage is supplied to an electrode provided in an electrostatic chuck, thereby adsorbing a substrate onto an upper surface of the electrostatic chuck. In step (b), after the voltage supplied to the electrode of the electrostatic chuck is stabilized, the supply of the voltage to the electrode is cut off, thereby bringing the electrode into a floating state. In step (c), after the voltage supplied to the electrode of the electrostatic chuck is stabilized, a predetermined processing with plasma is performed on a surface of the substrate adsorbed onto the electrostatic chuck.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a plasma processing method and a plasma processing apparatus of the present disclosure will be described in detail based on the drawings. The plasma processing apparatus and the plasma processing method of the present disclosure are not limited to the embodiments.

Meanwhile, a substrate adsorbing process is performed before the plasma processing. In the adsorbing process, in order to generate an electrostatic force with a predetermined magnitude between the substrate and a substrate adsorbing unit that adsorbs the substrate, a DC voltage with a predetermined magnitude is supplied to an electrode inside the substrate adsorbing unit. However, a self-bias occurs in the substrate during the plasma processing. Thus, during the plasma processing, the strength of the electrostatic force between the substrate and the substrate adsorbing unit fluctuates by the self-bias from a predetermined strength, so that when the strength becomes weak, the substrate may easily deviate from the substrate adsorbing unit, and when the strength becomes strong, the risks described below may occur.

When the electrostatic force between the substrate and the substrate adsorbing unit becomes strong, the frictional force between the substrate and the substrate adsorbing unit increases. As a result, an amount of particles generated by the friction between the substrate and the substrate adsorbing unit may increase in accordance with a difference in thermal expansion coefficient between the substrate and the substrate adsorbing unit. Further, when the substrate is charged by the self-bias generated during the plasma processing, the generated particles may easily adhere to the substrate. Further, in a case where the electrostatic force between the substrate and the substrate adsorbing unit becomes strong, the substrate may jump up or crack when the processed substrate is separated from the substrate adsorbing unit by lift pins or the like.

Thus, the present disclosure provides a technique capable of suppressing an excessive charging of the substrate during the plasma processing.

(First Embodiment)

[Configuration of Plasma Processing Apparatus 100]

Figure 1:
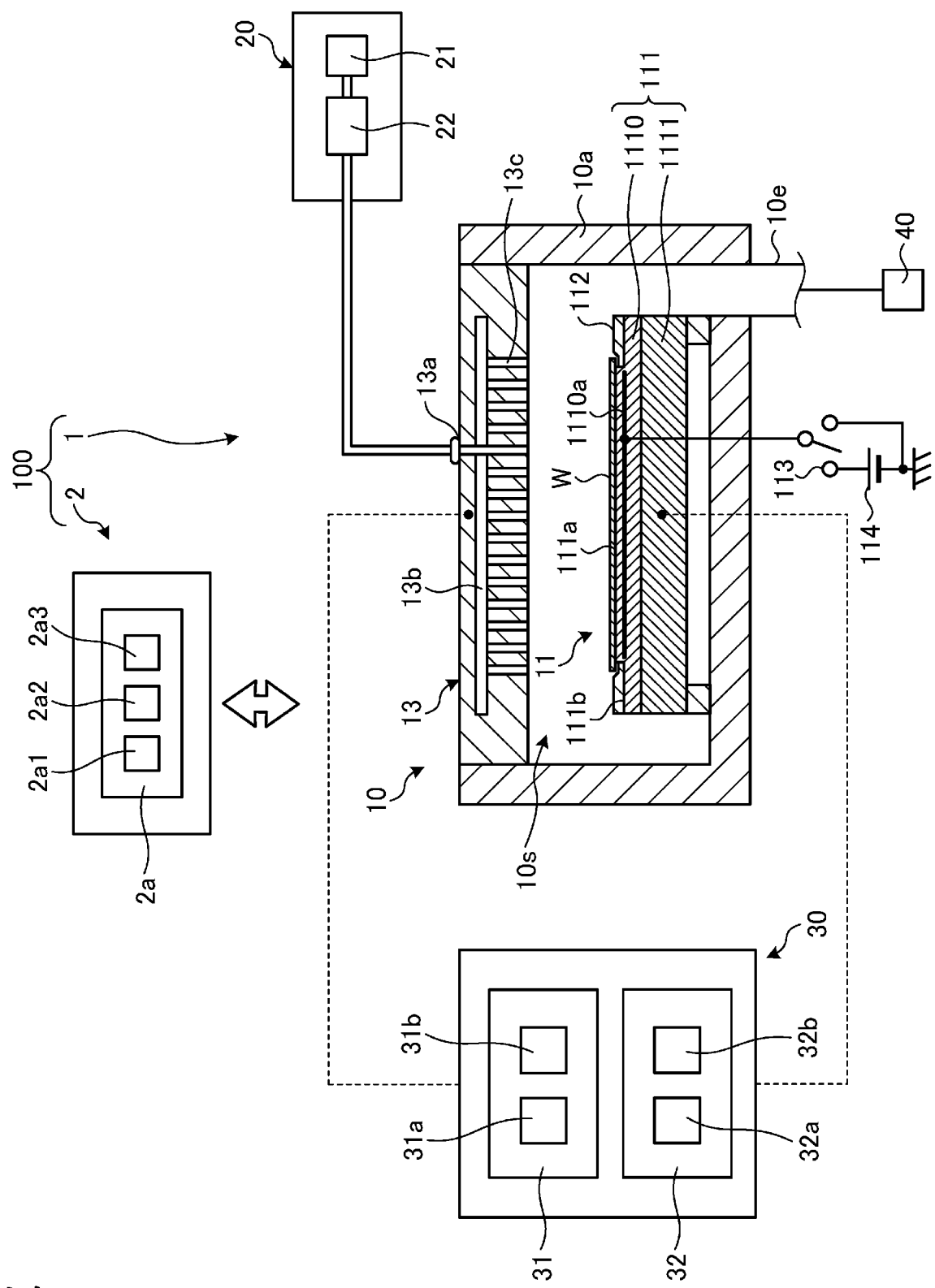
FIG. 1 is a view illustrating an example of a plasma processing apparatus according to a first embodiment of the present disclosure.

FIG. 1 is a view illustrating an example of a plasma processing apparatus 100 according to a first embodiment of the present disclosure. The plasma processing apparatus 100 includes an apparatus main body 1 and a controller 2. The apparatus main body 1 includes a plasma processing chamber 10, a gas supply 20, a power supply 30, and an exhaust system 40. Further, the apparatus main body 1 includes a substrate support 11 and a gas introduction unit. The gas introduction unit is configured to introduce at least one processing gas into a plasma processing space 10s. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10.

The plasma processing chamber 10 has the plasma processing space 10s defined by the shower head 13, the side wall 10a of the plasma processing chamber 10, and the substrate support 11. The plasma processing chamber 10 includes at least one gas supply port for supplying at least one processing gas to the plasma processing space 10s, and at least one gas discharge port for discharging a gas from the plasma processing space 10s. The side wall 10a is grounded. The shower head 13 and the substrate support 11 are electrically insulated from the housing of the plasma processing chamber 10.

The substrate support 11 includes a main body 111 and a ring assembly 112. The main body 111 includes a substrate support surface 111a which is a central region for supporting the substrate W, and a ring support surface 111b which is an annular region for supporting the ring assembly 112. The substrate W may be referred to as a wafer. The ring support surface 111b of the main body 111 surrounds the substrate support surface 111a of the main body 111 in a plan view. The substrate W is mounted on the substrate support surface 111a of the main body 111, and the ring assembly 112 is disposed on the ring support surface 111b of the main body 111 so as to surround the substrate W mounted on the substrate support surface 111a of the main body 111.

The main body 111 includes an electrostatic chuck 1110 and a base 1111. The electrostatic chuck 1110 is an example of a substrate adsorbing unit. The base 1111 includes a conductive member. The conductive member of the base 1111 functions as a lower electrode. The electrostatic chuck 1110 is disposed on the base 1111. The upper surface of the electrostatic chuck 1110 is the substrate support surface 111a. The electrostatic chuck 1110 is provided with an electrode 1110a. A DC power supply 114 is connected to the electrode 1110a via a switch 113. The electrostatic chuck 1110 generates an electrostatic force such as a Coulomb force on the substrate support surface 111a by a DC voltage supplied from the DC power supply 114 via the switch 113. As a result, the electrostatic chuck 1110 adsorbs the substrate W mounted on the substrate support surface 111a.

The ring assembly 112 includes one or more annular members. One annular member or at least one of the plurality of annular members is an edge ring. Further, although not illustrated, the substrate support 11 may include a temperature adjustment module configured to adjust at least one of the electrostatic chuck 1110, the ring assembly 112, and the substrate W to a target temperature. The temperature adjustment module may include a heater, a heat transfer medium, a flow path, or a combination thereof. A heat transfer fluid such as brine or a gas flows through the flow path. Further, the substrate support 11 may include a heat transfer gas supply configured to supply a heat transfer gas between the substrate W and the substrate support surface 111a.

Further, in the electrostatic chuck 1110 and the base 1111, a plurality of (e.g., three) lift pins (not illustrated) is provided to penetrate the electrostatic chuck 1110 and the base 1111. The plurality of lift pins are movable vertically to penetrate the electrostatic chuck 1110 and the base 1111. The substrate W for which the plasma processing has been completed is lifted by the lift pins, and carried out from the inside of the plasma processing chamber 10 by a transfer device such as a robot arm (not illustrated).

The shower head 13 is configured to introduce at least one processing gas from the gas supply 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. Further, the gas introduction unit may include one or a plurality of side gas injectors (SGI) attached to one or a plurality of openings formed in the side wall 10a, in addition to the shower head 13.

The gas supply 20 may include at least one gas source 21 and at least one flow rate controller 22. In an embodiment, the gas supply 20 is configured to supply at least one processing gas from a corresponding gas source 21 to the shower head 13 via a corresponding flow rate controller 22. Each flow rate controller 22 may include, for example, a mass flow controller or a pressure control type of a flow rate controller. Further, the gas supply 20 may include one or more flow rate modulation devices that modulate or pulse the flow rate of at least one processing gas.

The power supply 30 includes a radio frequency (RF) power supply 31 coupled to the plasma processing chamber 10 via at least one impedance matching circuit. The RF power supply 31 is configured to supply at least one RF signal such as a source RF signal or a bias RF signal, to the conductive member of the substrate support 11, the conductive member of the shower head 13, or both the conductive members. As a result, plasma is formed from at least one processing gas supplied to the plasma processing space 10s. Accordingly, the RF power supply 31 may function as at least a portion of a plasma generator configured to generate plasma from one or more processing gases in the plasma processing chamber 10. Further, by supplying the bias RF signal to the conductive member of the substrate support 11, a bias potential is generated on the substrate W, and ion components in the formed plasma may be drawn into the substrate W.

In an embodiment, the RF power supply 31 includes a first RF generator 31a and a second RF generator 31b. The first RF generator 31a is coupled to the conductive member of the substrate support 11, the conductive member of the shower head 13, or both the conductive members via at least one impedance matching circuit, and configured to generate a source RF signal for generating plasma. The source RF signal may be referred to as a source RF power. In an embodiment, the source RF signal has a signal of a frequency in the range of 13 MHz to 150 MHz. In an embodiment, the first RF generator 31a may be configured to generate multiple source RF signals having different frequencies. The generated one or more source RF signals are supplied to the conductive member of the substrate support 11, the conductive member of the shower head 13, or both the conductive members.

The second RF generator 31b is coupled to the conductive member of the substrate support 11 via at least one impedance matching circuit, and configured to generate a bias RF signal. The bias RF signal may be referred to as a bias RF power. In an embodiment, the bias RF signal has a frequency lower than that of the source RF signal. In an embodiment, the bias RF signal has a signal of a frequency in the range of 400 kHz to 13.56 MHz. In an embodiment, the second RF generator 31b may be configured to generate a plurality of bias RF signals having different frequencies. The generated one or more bias RF signals are supplied to the conductive member of the substrate support 11. In various embodiments, at least one of the source RF signal and the bias RF signal may be pulsed.

Further, the power supply 30 may include a direct current (DC) power supply 32 coupled to the plasma processing chamber 10. The DC power supply 32 includes a first DC generator 32a and a second DC generator 32b. In an embodiment, the first DC generator 32a is connected to the conductive member of the substrate support 11, and configured to generate a first DC signal. The generated first DC signal is applied to the conductive member of the substrate support 11. In another embodiment, the first DC signal may be applied to another electrode such as the electrode 1110a in the electrostatic chuck 1110. In an embodiment, the second DC generator 32b is connected to the conductive member of the shower head 13, and configured to generate a second DC signal. The generated second DC signal is applied to the conductive member of the shower head 13. In various embodiments, at least one of the first and second DC signals may be pulsed. Further, the first DC generator 32a and the second DC generator 32b may be provided in addition to the RF power supply 31, or the first DC generator 32a may be provided in place of the second RF generator 31b.

The exhaust system 40 may be connected to a gas outlet 10e provided at, for example, the bottom of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

The controller 2 processes computer executable instructions for causing the apparatus main body 1 to perform various steps described in the present disclosure. The controller 2 may be configured to control each component of the apparatus main body 1 to perform the various steps described herein. In an embodiment, a part of the controller 2 or the entire controller 2 may be included in the apparatus main body 1. The controller 2 may include, for example, a computer 2a. The computer 2a may include, for example, a processing unit 2a1, a storage unit 2a2, and a communication interface 2a3. The processing unit 2a1 may be configured to perform various control operations based on programs stored in the storage unit 2a2. The processing unit 2a1 may include a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the apparatus main body 1 through a communication line such as a local area network (LAN).

[Process of Adsorbing Substrate W]

When the plasma processing is performed on the substrate W, the substrate W is carried into the plasma processing chamber 10. Then, after the substrate W is mounted on the electrostatic chuck 1110, the adsorbing process is performed so that the substrate W is adsorbed onto the substrate support surface 111a. In the adsorbing process, the switch 113 is turned ON (conduction state), and a DC voltage having a predetermined magnitude is supplied from the DC power supply 114 to the electrode 1110a inside the electrostatic chuck 1110 via the switch 113. Then, a processing gas is supplied from the gas supply 20 into the plasma processing space 10s via the shower head 13, and an RF source signal is supplied from the RF power supply 31 to the conductive member of the substrate support 11, the conductive member of the shower head 13, or both the conductive members. The gas supplied into the plasma processing space 10s may be an inert gas such as argon gas. As a result, plasma is generated in the plasma processing space 10s, and for example, a closed circuit is formed as illustrated in FIG. 2.

Figure 2:
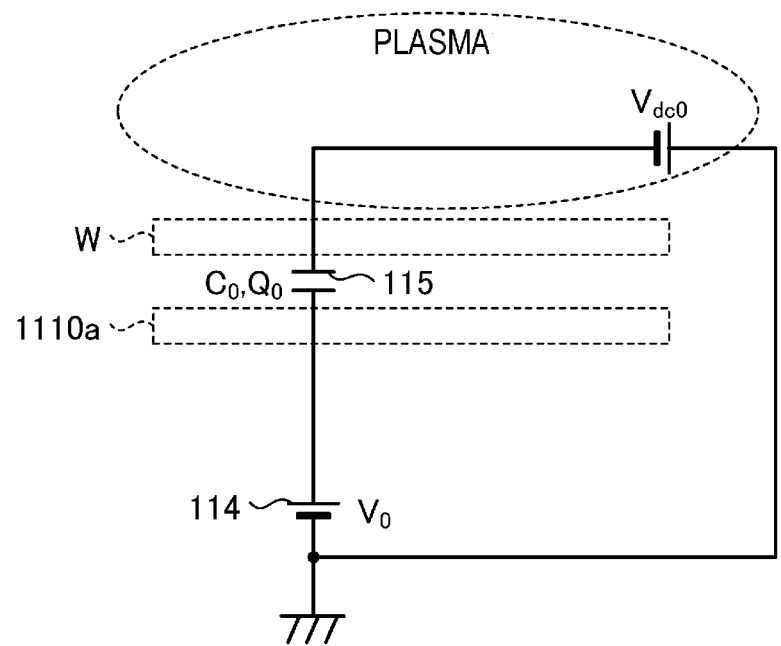
FIG. 2 is a view illustrating an example of an equivalent circuit when a substrate is adsorbed.

As illustrated in FIG. 2, a capacitance component 115 having a capacitance $C_0$ exists between the substrate W and the electrode 1110a. Further, a self-bias $V_{dc0}$ is generated on the substrate W by the plasma. Here, in the adsorbing process, plasma is generated to form the closed circuit through the plasma. At this time, when the self-bias $V_{dc0}$ generated by the plasma is excessively large, the substrate W may be damaged in the adsorbing process before the original plasma processing using the processing gas is performed. Thus, in the adsorbing process, weak plasma that generates a small self-bias $V_{dc0}$ is generated.

Assuming that the DC voltage supplied from the DC power supply 114 is $V_0$, and the charge charged to the capacitance component 115 is $Q_0$, the electrostatic force $F_0$ generated between the substrate W and the electrode 1110a by the capacitance component 115 is expressed by, for example, Equation (1) below, since the self-bias $V_{dc0}$ is so small to be negligible as compared with $V_0$.

$$F_0 = k\left(\frac{Q_0}{r}\right)^2 = k\left(\frac{C_0(V_0 + V_{dc0})}{r}\right)^2 \cong k\left(\frac{C_0 V_0}{r}\right)^2 \qquad (1)$$

In Equation (1) above, "k" is a constant, and "r" is the distance between the substrate W and the electrode 1110a. The DC voltage $V_0$ supplied to the electrode 1110a is preset to a value at which the electrostatic force $F_0$ becomes a predetermined magnitude.

[Charging of Substrate in Comparative Example]

Figure 3:
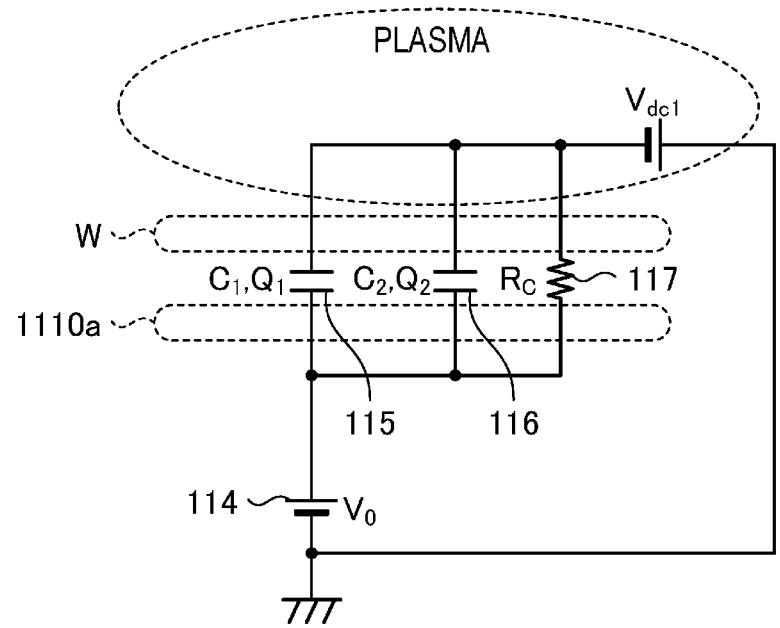
FIG. 3 is a view illustrating an example of an equivalent circuit during a plasma processing in a comparative example.

Here, descriptions will be made on a comparative example for a case where the plasma processing is performed in a state where the switch 113 is turned ON (conduction state). FIG. 3 is a view illustrating an example of an equivalent circuit during the plasma processing in the comparative example.

When the plasma processing on the substrate W is started, a self-bias $V_{dc1}$ larger than the self-bias $V_{dc0}$ in the adsorbing process is generated. Further, when the plasma processing is started, the adsorption state between the substrate W and the substrate support surface 111a changes due to the influence of the plasma, and the capacitance of the capacitance component 115 between the substrate W and the electrode 1110a changes into $C_1$. Further, when the plasma processing is started, the temperature of the substrate W or the state of the surface of the electrostatic chuck 1110 changes due to the influence of the plasma, and the state of the contact surface between the substrate W and the substrate support surface 111a changes. As a result, a capacitance component 116 of a capacitance $C_2$ or a resistance component 117 of a resistance value $R_C$ is generated between the substrate W and the electrode 1110a.

The charge $Q_1$ accumulated in the capacitance component 115 and the charge $Q_2$ accumulated in the capacitance component 116 are expressed by, for example, Equation (2) below. The capacitance $C_1$ of the capacitance component 115 during the plasma processing is substantially identical in size to the capacitance $C_0$ of the capacitance component 115 during the adsorbing process.

$$Q_1 = C_1(V_0 + V_{dc1}) \\ Q_2 = C_2(V_0 + V_{dc1}) \quad (2)$$

Here, the charge $Q_0$ accumulated in the capacitance component 115 during the adsorbing process is $C_0V_0$, and thus, referring to Equation (2) above, charges $Q_1$ and $Q_2$ larger than the charge $Q_0$ accumulated during the adsorbing process are accumulated in the substrate W during the plasma processing due to the influence of the self-bias $V_{dc1}$. As a result, particles generated in the plasma processing space 10s during the plasma processing are easily attracted to the substrate W.

Further, the electrostatic force F generated between the substrate W and the electrode 1110a by the capacitance components 115 and 116 is expressed by, for example, Equation (3) below.

$$F = F_1 + F_2 \quad (3)$$
$$= k\left(\frac{Q_1}{r}\right)^2 + k\left(\frac{Q_2}{r}\right)^2$$
$$= k\left(\frac{C_1(V_0 + V_{dc0})}{r}\right)^2 + \left(\frac{C_2(V_0 + V_{dc1})}{r}\right)^2$$

Here, since the capacitance $C_2$ of the capacitance component 116 is so small to be negligible as compared with the capacitance $C_1$ of the capacitance component 115, the electrostatic force F generated between the substrate W and the electrode 1110a may be approximated by, for example, Equation (4) below.

$$F \cong k\left(\frac{C_1(V_0 + V_{dc1})}{r}\right)^2 \quad (4)$$

Upon comparing Equation (4) above with Equation (1), the electrostatic force F during the plasma processing becomes larger than the electrostatic force $F_0$ during the adsorbing process, due to the influence of the self-bias $V_{dc1}$. As such, it is believed that the adsorption force between the substrate W and the electrostatic chuck 1110 during the plasma processing becomes excessive in the comparative example. Further, since the self-bias $V_{dc1}$ fluctuates according to the state of the plasma processing, it is difficult to accurately preset the DC voltage $V_0$ having the magnitude in consideration of the self-bias $V_{dc1}$.

When the adsorption force between the substrate W and the electrostatic chuck 1110 becomes excessive, the frictional force between the substrate W and the substrate support surface 111a increases. As a result, the amount of particles generated by the friction between the substrate W and the substrate support surface 111a may increase in accordance with the difference in thermal expansion coefficient between the substrate W and the substrate support surface 111a. Further, in a case where the adsorption force between the substrate W and the substrate support surface 111a becomes excessive, the substrate W may jump up or crack when the substrate W is separated from the substrate support surface 111a by the lift pins or the like after the plasma processing.

[Charging of Substrate in Present Embodiment]

Figure 4:
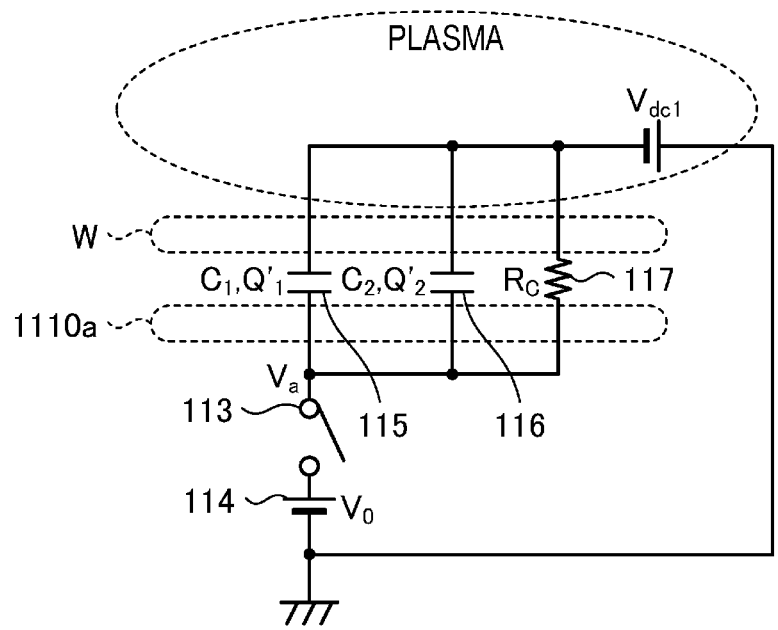
FIG. 4 is a view illustrating an example of an equivalent circuit during a plasma processing according to an embodiment of the present disclosure.

FIG. 4 is a view illustrating an example of an equivalent circuit during the plasma processing in the present embodiment. In the present embodiment, after the voltage supplied to the electrode 1110a of the electrostatic chuck 1110 during the adsorbing process is stabilized, the switch 113 is turned OFF (open state), and the plasma processing is performed. When the switch 113 is turned OFF, the electrode 1110a enters a floating state.

In the present embodiment as well, when the plasma processing on the substrate W is started, the self-bias $V_{dc1}$ larger than the self-bias $V_{dc0}$ in the adsorbing process is generated. Further, when the plasma processing is started, the adsorption state between the substrate W and the substrate support surface 111a changes due to the influence of the plasma, and the capacitance of the capacitance component 115 between the substrate W and the electrode 1110a changes into $C_1$. Further, when the plasma processing is started, the temperature of the substrate W or the state of the surface of the electrostatic chuck 1110 changes due to the influence of the plasma, and the capacitance component 116 of the capacitance $C_2$ or the resistance component 117 of the resistance value $R_C$ is generated between the substrate W and the electrode 1110a.

Here, in the present embodiment, the switch 113 is turned OFF (open state). Thus, the relationship expressed by Equation (5) below is established according to the charge conservation law, among the charge $Q_0$ accumulated in the capacitance component 115 during the adsorbing process, and a charge $Q_1'$ accumulated in the capacitance component 115 and a charge $Q_2'$ accumulated in the capacitance component 116 during the plasma processing.

$$Q_0 = C_0V_0 = Q_1' + Q_2' \quad (5)$$

Further, the charge $Q_1'$ accumulated in the capacitance component 115 and the charge $Q_2'$ accumulated in the capacitive component 116 during the plasma processing are expressed by Equations (6) below, respectively.

$$Q_1' = C_1(V_a + V_{dc1}) \\ Q_2' = C_2(V_a + V_{dc1}) \quad (6)$$

Assuming that the voltage of the electrode 1110a during the plasma processing is $V_a$, the voltage $V_a$ is expressed by, for example, Equation (7) below in view of Equations (5) and (6) above.

$$V_a = V_0 - V_{dc1} \quad (7)$$

Further, from Equations (6) and (7) above, the charge $Q_1'$ accumulated in the capacitance component 115 and the charge $Q_2'$ accumulated in the capacitance component 116 during the plasma processing are expressed by Equations (8) below, respectively.

$$Q_1' = C_1V_0 \\ Q_2' = C_2V_0 \quad (8)$$

Referring to Equations (5) and (8) above, the charge equal to the charge $Q_0$ accumulated during the adsorbing process is accumulated in the substrate W even during the plasma processing, regardless of the magnitude of the self-bias $V_{dc1}$.

As described above, in the present embodiment, during the plasma processing, the switch 113 is turned OFF (open state), and the electrode 1110a enters into the floating state, so that the excessive charging of the substrate W is suppressed during the plasma processing. Thus, the particles generated in the plasma processing space 10s during the plasma processing may be suppressed from being attracted to the substrate W.

Further, the electrostatic force F' generated between the substrate W and the electrode 1110a by the capacitance components 115 and 116 is expressed by, for example, Equation (9) below.

$$F' = F'_1 + F'_2 \qquad (9)$$
$$= k\left(\frac{Q'_1}{r}\right)^2 + k\left(\frac{Q'_2}{r}\right)^2$$
$$= k\left(\frac{C_1(V_a + V_{dc1})}{r}\right)^2 + \left(\frac{C_2(V_a + V_{dc1})}{r}\right)^2$$

Here, since the capacitance $C_2$ of the capacitance component 116 is so small to be negligible as compared with the capacitance $C_1$ of the capacitance component 115, the electrostatic force F' generated between the substrate W and the electrode 1110a may be approximated by, for example, Equation (10) below.

$$F' \cong k\left(\frac{C_1(V_a + V_{dc1})}{r}\right)^2 = k\left(\frac{C_1 V_0}{r}\right)^2 \qquad (10)$$

The capacitance $C_1$ of the capacitance component 115 is substantially the same as the capacitance $C_0$ of the capacitance component 115 during the adsorbing process. Thus, referring to Equations (1) and (10) above, the electrostatic force F' equal to the electrostatic force $F_0$ generated between the substrate W and the electrode 1110a during the adsorbing process is generated in the substrate W even during the plasma processing, regardless of the magnitude of the self-bias $V_{dc1}$.

In this way, in the present embodiment, during the plasma processing, the switch 113 is turned OFF (open state), and the electrode 1110a enters the floating state, so that it is possible to suppress the generation of the excessive electrostatic force between the substrate W and the electrode 1110a during the plasma processing. As a result, the increase of the frictional force between the substrate W and the substrate support surface 111a is suppressed, so that it is possible to suppress the particles generated by the friction between the substrate W and the substrate support surface 111a in accordance with the difference in thermal expansion coefficient between the substrate W and the substrate support surface 111a. Further, since the increase of the adsorption force between the substrate W and the substrate support surface 111a is suppressed, the substrate W may be suppressed from jumping up or cracking when the substrate W is separated from the substrate support surface 111a by the lift pins or the like after the plasma processing.

[Plasma Processing Method]

Figure 5:
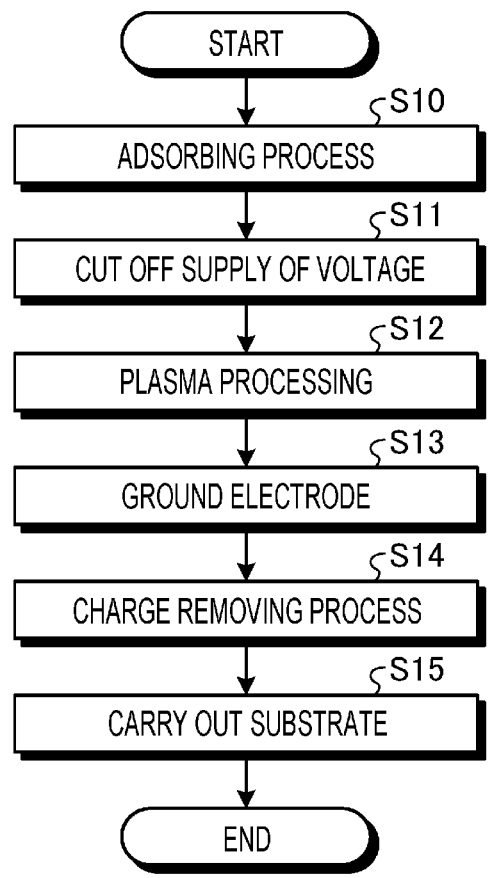
FIG. 5 is a flowchart illustrating an example of a plasma processing method according to the first embodiment of the present disclosure.
Figure 6:
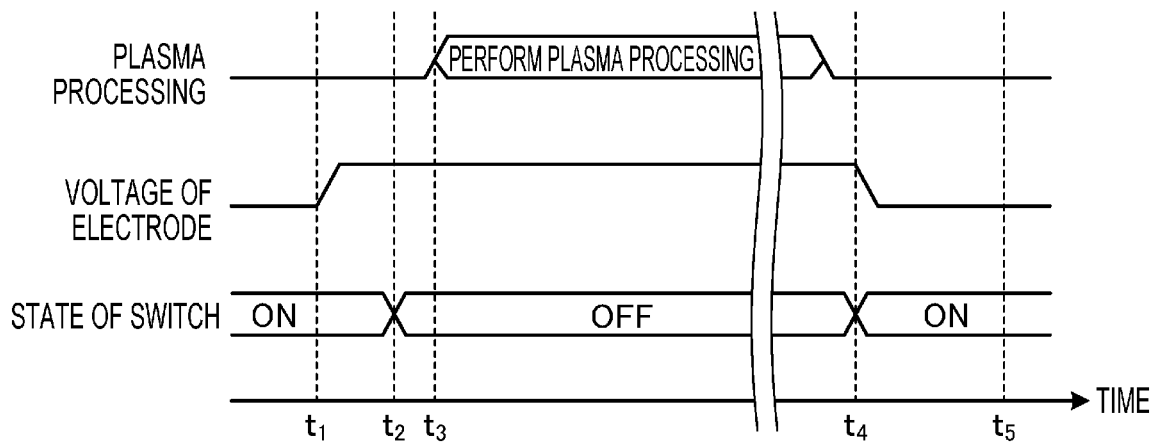
FIG. 6 is a time chart illustrating an example of a control process according to the first embodiment of the present disclosure.

FIG. 5 is a flowchart illustrating an example of a plasma processing method according to the first embodiment of the present disclosure. For example, the process illustrated in FIG. 5 is started when the unprocessed substrate W is mounted on the electrostatic chuck 1110. Each process illustrated in FIG. 5 is implemented in the manner that the controller 2 controls each unit of the apparatus main body 1. Hereinafter, descriptions will be made referring to the time chart illustrated in FIG. 6.

First, step S10 in which the adsorbing process is performed (S10) is an example of step (a). In step S10, for example, at a timing $t_1$ of FIG. 6, the switch 113 is turned ON (conduction state), and a DC voltage having a predetermined magnitude is supplied from the DC power supply 114 to the electrode 1110a via the switch 113. Then, the processing gas is supplied from the gas supply 20 into the plasma processing space 10s through the shower head 13, and the RF source signal is supplied from the RF power supply 31 to the conductive member of the substrate support 11, the conductive member of the shower head 13, or both the conductive members. The gas supplied into the plasma processing space 10s may be an inert gas such as argon gas. As a result, plasma is generated in the plasma processing space 10s, and for example, the closed circuit illustrated in FIG. 2 is formed. Then, the substrate W is adsorbed onto the substrate support surface 111a by the electrostatic force $F_0$ caused from the charge $Q_0$ accumulated in the capacitance component 115 between the substrate W and the electrode 1110a.

Next, at a timing $t_2$ (see FIG. 6) after the DC voltage supplied to the electrode 1110a is stabilized, the switch 113 is turned OFF (open state), and the supply of the DC voltage to the electrode 1110a is cut off (S11). Step S11 is an example of step (b). As a result, the electrode 1110a enters the floating state. In the present embodiment, the electrode 1110a enters the floating state before the plasma processing on the substrate W is started. As a result, the excessive charging of the substrate W during the plasma processing may be suppressed.

Next, at a timing $t_3$ (see FIG. 6) after the switch 113 is turned OFF (open state), the plasma processing on the substrate W is performed (S12). Step S12 is an example of step (c). In step S12, the processing gas is supplied from the gas supply 20 into the plasma processing space 10s through the shower head 13, and the RF source signal is supplied from the RF power supply 31 to the conductive member of the substrate support 11, the conductive member of the shower head 13, or both the conductive members. As a result, plasma is generated in the plasma processing space 10s, and for example, a closed circuit is formed as illustrated in FIG. 4. Then, the bias RF signal is supplied from the RF power supply 31 to the conductive member of the substrate support 11, so that the bias potential is generated on the substrate W, the ion components in the plasma are drawn into the substrate W, and a process such as an etching is performed on the substrate W.

Next, at a timing $t_4$ (see FIG. 6) after the plasma processing is completed, the electrode 1110a is grounded by the switch 113 (S13). Further, in step S13, the switch 113 may supply a DC voltage having a polarity opposite to the DC voltage $V_0$ during the adsorbing process and having a predetermined magnitude, to the electrode 1110a of the electrostatic chuck 1110.

Next, the charge removing process is performed (S14). Steps S13 and S14 are an example of step (d). In step S14, an inert gas such as argon gas is supplied from the gas supply 20 into the plasma processing space 10s through the shower head 13. Then, the RF source signal is supplied from the RF power supply 31 to the conductive member of the substrate support 11, the conductive member of the shower head 13, or both the conductive members. As a result, plasma is generated in the plasma processing space 10s, and the charge accumulated in the substrate W is removed.

Next, at a timing $t_5$ (see FIG. 6) when the charge accumulated in the substrate W is sufficiently removed, the substrate W is lifted by the lift pins (not illustrated), and carried out from the inside of the plasma processing chamber 10 by a transfer device such as a robot arm (not illustrated) (S15). Then, the plasma processing method illustrated in the flowchart is completed.

[Experimental Results]

Figure 7:
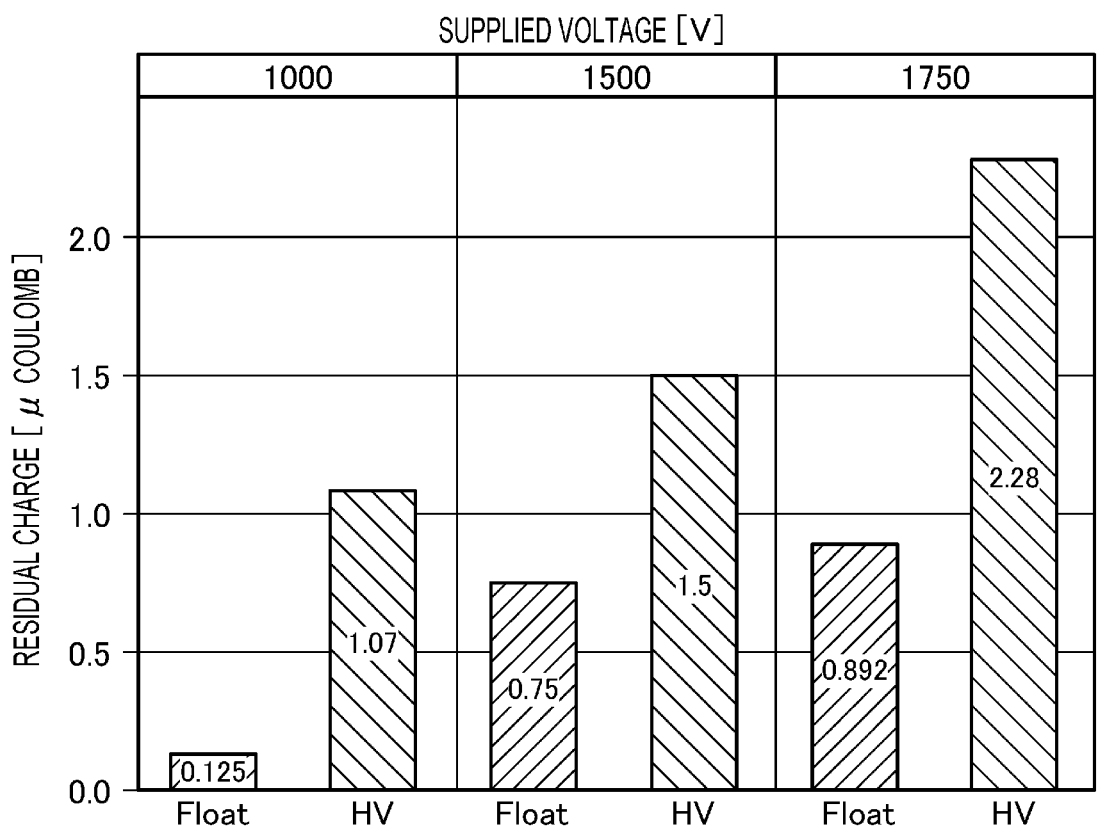
FIG. 7 is a view illustrating an example of a residual charge of the substrate after the plasma processing.

FIG. 7 is a view illustrating an example of a residual charge of the substrate W after the plasma processing. In FIG. 7, "Float" represents the measurement result of the residual charge in the plasma processing method of the present embodiment in which the electrode 1110a enters the floating state during the plasma processing. Meanwhile, in FIG. 7, "HV" represents the measurement result of the residual charge in the plasma processing method of the comparative example in which the DC voltage is continuously supplied to the electrode 1110a during the plasma processing.

Referring to FIG. 7, in both the present embodiment and the comparative example, the residual charge of the substrate W tends to increase as the DC voltage supplied to the electrode 1110a increases. However, for any magnitude of the DC voltage, the residual charge of the substrate W is significantly reduced in the plasma processing method of the present embodiment, as compared to the plasma processing method of the comparative example.

Figure 8:
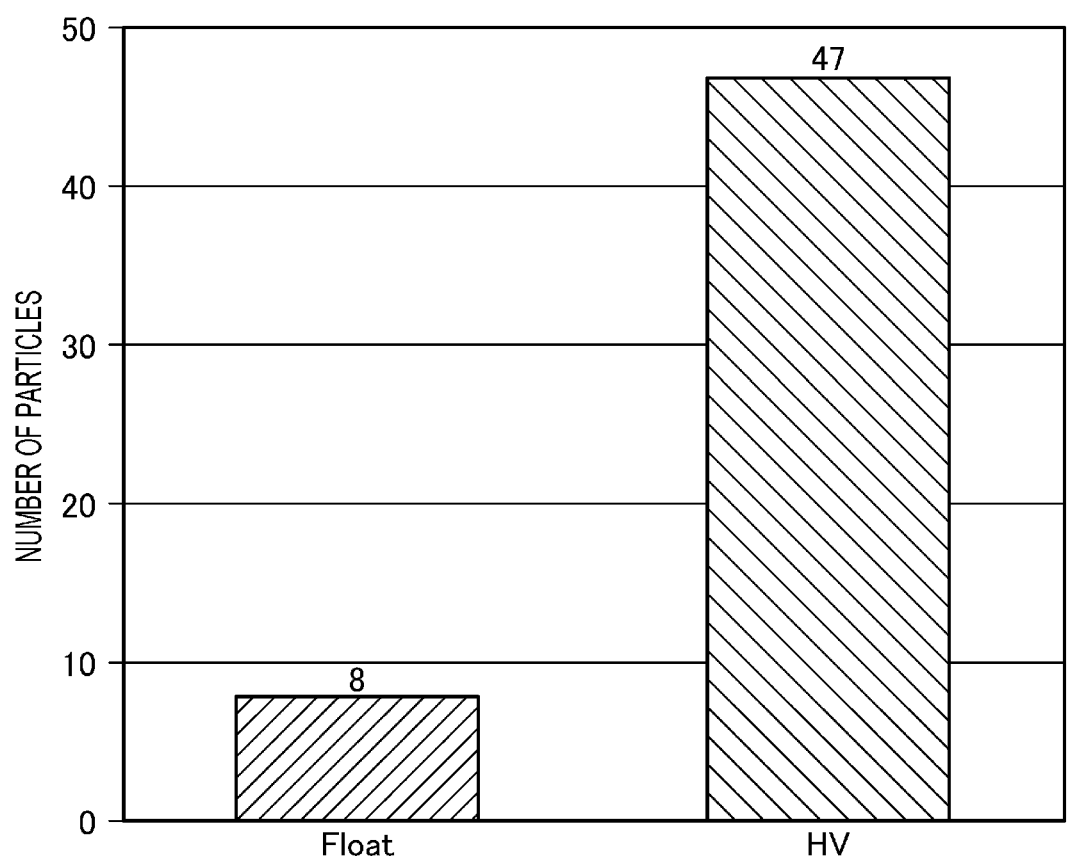
FIG. 8 is a view illustrating an example of the number of particles adhering to the substrate after the plasma processing.

FIG. 8 is a view illustrating an example of the number of particles adhering to the substrate W after the plasma processing. Referring to FIG. 8, the number of particles adhering to the substrate W is significantly reduced in the plasma processing method of the present embodiment, as compared with the plasma processing method of the comparative example. As described above, in the present embodiment, the electrode 1110a enters the floating state during the plasma processing, so that the excessive charging of the substrate W is suppressed during the plasma processing. As a result, the particles generated in the plasma processing space 10s during the plasma processing are suppressed from being attracted to the substrate W.

The first embodiment has been described. As described above, the plasma processing method according to the present embodiment includes steps (a), (b), and (c). In step (a), a voltage is supplied to the electrode 1110a provided in the electrostatic chuck 1110, thereby adsorbing the substrate W onto the upper surface of the electrostatic chuck 1110. In step (b), after the voltage supplied to the electrode 1110a of the electrostatic chuck 1110 is stabilized, the supply of the voltage to the electrode 1110a is cut off, thereby bringing the electrode 1110a into the floating state. In step (c), after the voltage supplied to the electrode 1110a of the electrostatic chuck 1110 is stabilized, a predetermined processing is performed on the surface of the substrate W adsorbed to the electrostatic chuck 1110. As a result, the excessive charging of the substrate W during the plasma processing may be suppressed.

Further, in the embodiment described above, step (b) is performed before step (c) is performed. As a result, the electrode 1110a may be brought into the floating state before the substrate W is excessively charged. Thus, the excessive charging of the substrate W during the plasma processing may be more reliably suppressed.

Further, the plasma processing method according to the embodiment described above further includes step (d) of removing the charge accumulated in the electrode 1110a of the electrostatic chuck 1110 after the plasma is stopped. As a result, the substrate W may be suppressed from jumping up or cracking when the substrate W is carried out after the plasma processing.

(Second Embodiment)

During the plasma processing, the resistance component 117 of the resistance value $R_C$ exists between the substrate W and the electrode 1110a as illustrated in, for example, FIG. 4. Thus, a part of the charge accumulated in the capacitance components 115 and 116 is consumed by the resistance component 117. When the time for the plasma processing is long, the electrostatic force F' between the substrate W and the electrode 1110a may decrease due to the decrease of the charge accumulated in the capacitance components 115 and 116.

Thus, in the present embodiment, the voltage that corresponds to the charges accumulated in the capacitance components 115 and 116 at the start time of the plasma processing is measured, and the measurement value is stored. Then, the voltage that corresponds to the charges accumulated in the capacitance components 115 and 116 during the plasma processing is measured, and when the value of the measured voltage becomes less than a predetermined value, the voltage that corresponds to the stored measurement value is supplied to the electrode 1110a. As a result, even when the time for the plasma processing is long, the decrease of the electrostatic force F' between the substrate W and the electrode 1110a may be suppressed.

[Configuration of Plasma Processing Apparatus 100]

Figure 9:
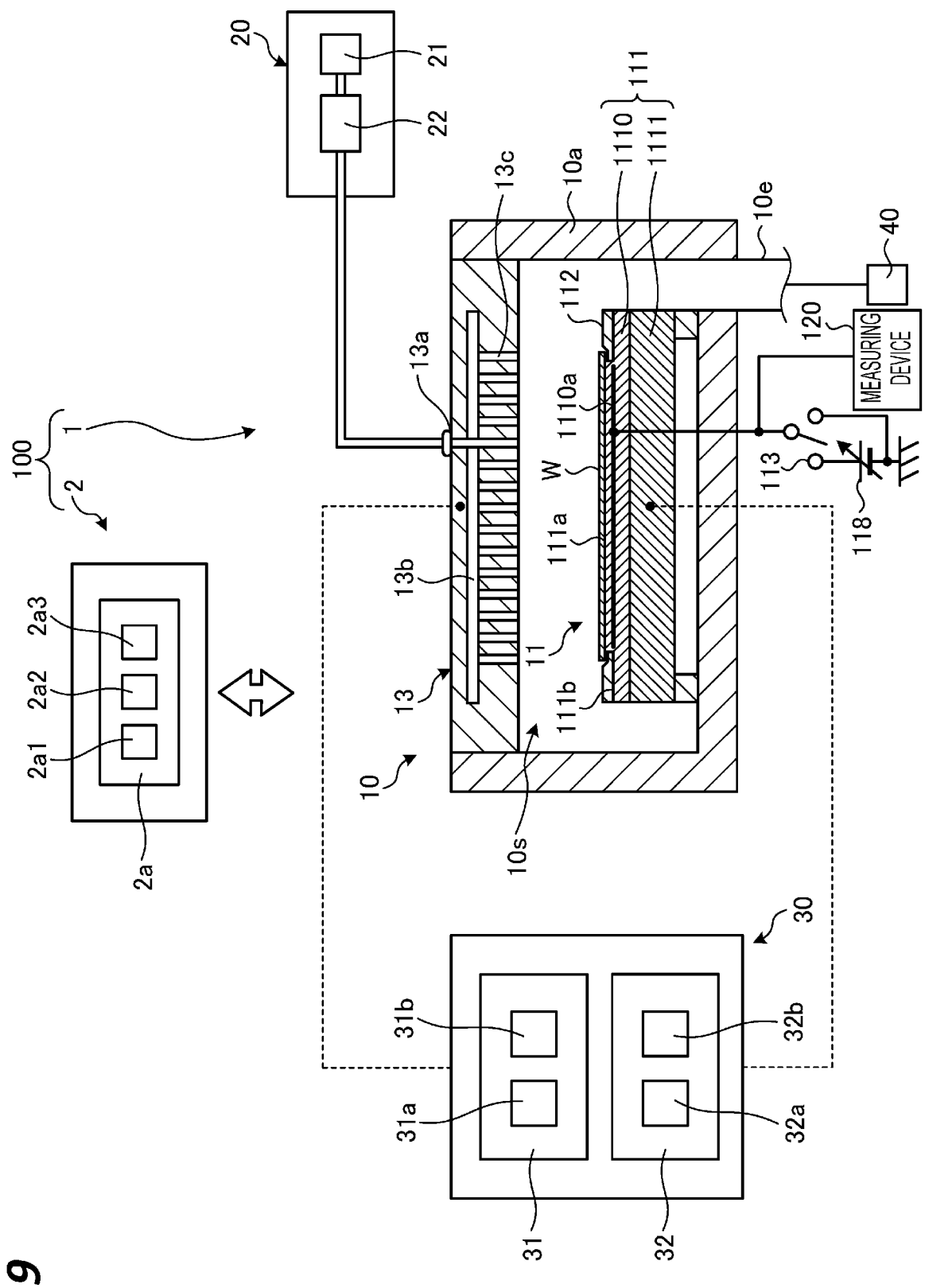
FIG. 9 is a view illustrating an example of a plasma processing apparatus according to a second embodiment of the present disclosure.

FIG. 9 is a view illustrating an example of a plasma processing apparatus 100 according to a second embodiment of the present disclosure. Except for the portions described below, in FIG. 9, the components denoted by the same reference numerals as those in FIG. 1 are the same or have the same functions as those of FIG. 1, and thus, descriptions thereof will be omitted.

A variable DC power supply 118 is connected to the electrode 1110a of the electrostatic chuck 1110 via the switch 113. The controller 2 controls the magnitude of the voltage output from the variable DC power supply 118. Further, a measuring device 120 is connected to the electrode 1110a. The measuring device 120 measures the voltage of the electrode 1110a, and outputs the measurement result to the controller 2. In the present embodiment, the measuring device 120 is, for example, a surface electrometer.

[Plasma Processing Method]

Figure 10:
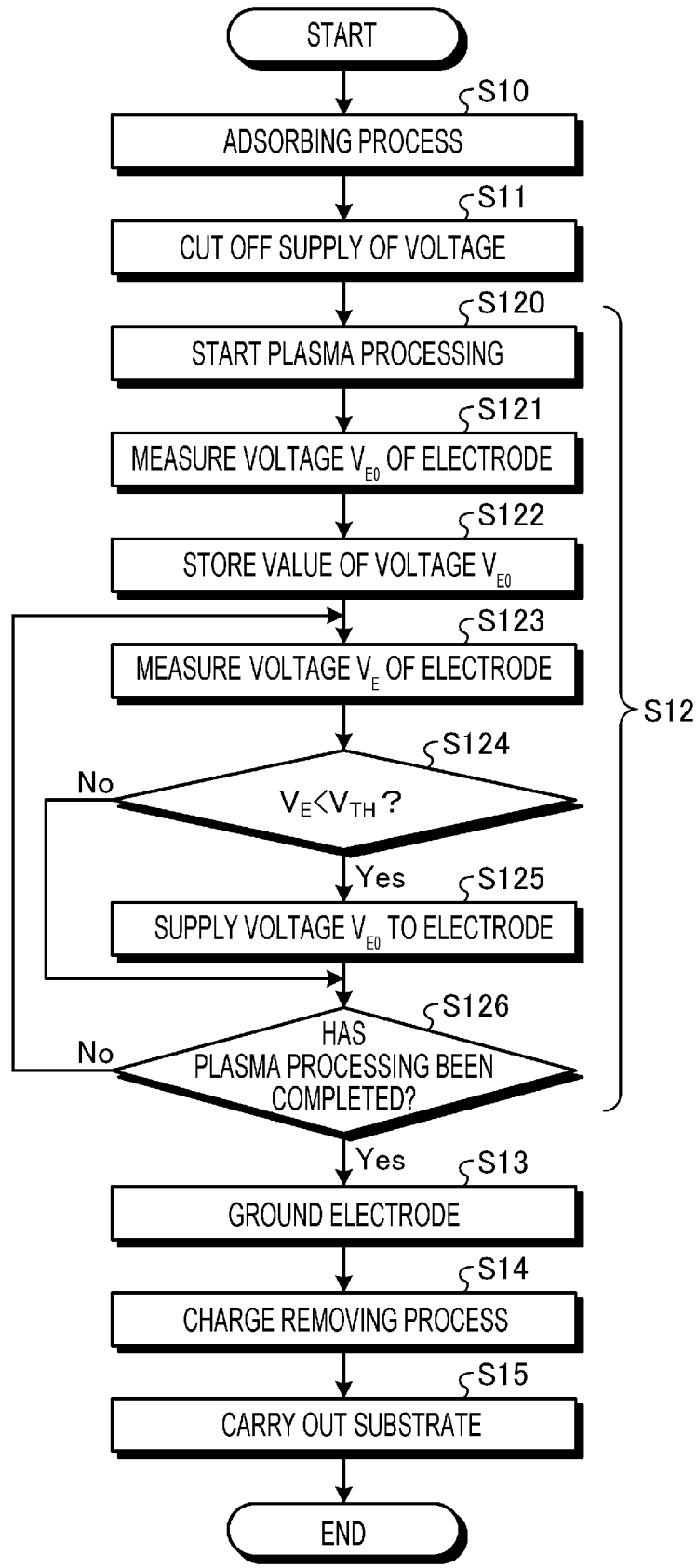
FIG. 10 is a flowchart illustrating an example of a plasma processing method according to the second embodiment of the present disclosure.

FIG. 10 is a flowchart illustrating an example of a plasma processing method according to the second embodiment of the present disclosure. Except for the portions described below, in FIG. 10, the components denoted by the same reference numerals as those in FIG. 5 are the same or have the same functions as those of FIG. 5, and thus, descriptions thereof will be omitted.

In step S12 of the present embodiment, first, the plasma processing on the substrate W is started (S120). In step S120, the processing gas is supplied from the gas supply 20 into the plasma processing space 10s through the shower head 13, and the RF source signal is supplied from the RF power supply 31 to the conductive member of the substrate support 11, the conductive member of the shower head 13, or both the conductive members. As a result, plasma is generated in the plasma processing space 10s, and for example, the closed circuit illustrated in FIG. 4 is formed. Then, the bias RF signal is supplied from the RF power supply 31 to the conductive member of the substrate support 11, so that a bias potential is generated on the substrate W, the ion components in the plasma are drawn into the substrate W, and a processing such as an etching is performed on the substrate W.

Next, the controller 2 causes the measuring device 120 to measure the voltage $V_{E0}$ of the electrode 1110a (S121). The controller 2 may cause the measuring device 120 to measure the voltage $V_{E0}$ of the electrode 1110a after the plasma is stabilized. Then, the controller 2 stores the value of the voltage $V_{E0}$ of the electrode 1110a measured by the measuring device 120 in the storage unit 2a2 (S122). Steps S121 and S122 are an example of step (c-1).

Next, the controller 2 causes the measuring device 120 to measure the voltage $Y_E$ of the electrode 1110a (S123). Then, the controller 2 determines whether the value of the voltage $V_E$ of the electrode 1110a measured by the measuring device 120 is less than a predetermined threshold value $V_{TH}$ (S124). When it is determined that the value of the voltage $V_E$ of the electrode 1110a measured by the measuring device 120 is equal to or larger than the threshold value $V_{TH}$ (S124: No), the controller 2 performs the process represented in step S126.

Meanwhile, when it is determined that the value of the voltage $V_E$ of the electrode 1110a measured by the measuring device 120 is less than the threshold value $V_{TH}$ (S124: Yes), the controller 2 reads the value of the voltage $V_{E0}$ of the electrode 1110a stored in step S122 from the storage unit 2a2. Then, the controller 2 controls the variable DC power supply 118 to output the voltage $V_{E0}$ corresponding to the read value, and controls the switch 113 to be turned ON (conduction state). As a result, the voltage of the electrode 1110a is restored to the voltage $V_{E0}$. Steps S123 to S125 are an example of step (c-2).

Next, the controller 2 determines whether the plasma processing has been completed (S126). When it is determined that the plasma processing has not been completed (S126: No), the process represented in step S123 is performed again. Meanwhile, when it is determined that the plasma processing has been completed (S126: Yes), the process represented in step S13 is performed.

The second embodiment has been described. As described above, in the plasma processing method of the present embodiment, step (c) includes steps (c-1) and (c-2). In step (c-1), the voltage of the electrode 1110a at the start time of the plasma processing is measured, and the value of the measured voltage of the electrode 1110a is stored. In step (c-2), the voltage of the electrode 1110a during the plasma processing is measured, and when the measured voltage of the electrode 1110a is less than a predetermined threshold value, the voltage of the value stored in step (c-1) is supplied to the electrode 1110a. As a result, it is possible to suppress the decrease in electrostatic force F' between the substrate W and the electrode 1110a even when the plasma processing time is long.

[Miscellaneous]

The technique disclosed in the present disclosure is not limited to the embodiments described above, and may be variously modified within the scope of the gist of the present disclosure.

For example, in each of the embodiments above, the supply of the voltage to the electrode 1110a is cut off, and the electrode 1110a is brought into the floating state, before the plasma processing is started. However, the present disclosure is not limited thereto. The timing for bringing the electrode 1110a into the floating state may be a timing after the plasma processing is started. Since the self-bias generated by the plasma is not so large immediately after the plasma processing is started, the charging amount of the substrate W does not increase so much. Thus, the timing for bringing the electrode 1110a into the floating state may be a timing immediately after the plasma processing is started.

Further, in the second embodiment described above, the controller 2 causes the measuring device 120 to measure the voltage $Y_E$ of the electrode 1110a during the plasma processing, and when the value of the measured voltage $V_E$ becomes less than the threshold value $V_{TH}$, the voltage $V_{E0}$ is supplied to the electrode 1110a. However, the present disclosure is not limited thereto. For example, in another embodiment, the controller 2 may supply the voltage $V_{E0}$ to the electrode 1110a when the duration time of the plasma processing is equal to or longer than a predetermined time. The predetermined time is, for example, a time from the start of the plasma processing until the voltage of the electrode 1110a becomes less than the threshold value $V_{TH}$.

Alternatively, when the duration time of the plasma processing becomes equal to or longer than the predetermined time, the controller 2 may temporarily stop the plasma, and control the switch 113 to be turned ON (conducting state) so as to perform the adsorbing process again.

Further, in the embodiments above, the plasma processing apparatus 100 that performs the processing using capacitively coupled plasma (CCP) as an example of the plasma source has been described. However, the plasma source is not limited thereto. Examples of plasma sources other than the capacitively coupled plasma include inductively coupled plasma (ICP), microwave-excited surface wave plasma (SWP), electron cyclotron resonance plasma (ECP), and helicon wave-excited plasma (HWP).

According to various aspects and embodiments of the present disclosure, the excessive charging of the substrate during the plasma processing may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method, comprising:
   (a) supplying a voltage to an electrode of an electrostatic chuck, thereby adsorbing a substrate onto an upper surface of the electrostatic chuck;
   (b) after the voltage supplied to the electrode is stabilized to reach a predetermined value, cutting off supply of the voltage to the electrode, thereby bringing the electrode into a floating state; and
   (c) after the voltage supplied to the electrode is stabilized to reach the predetermined value and the supply of the voltage to the electrode is cut off, performing a predetermined processing with plasma on a surface of the substrate adsorbed onto the electrostatic chuck in a state where the electrode is in the floating state.

2. The plasma processing method according to claim 1, further comprising:
   (d) removing a charge accumulated in the electrode after the plasma is stopped.

3. The plasma processing method according to claim 2, wherein (c) includes
   (c-1) measuring a voltage of the electrode when the processing with plasma is started, and storing a value of the measured voltage of the electrode, and
   (c-2) measuring the voltage of the electrode during the processing with plasma, and when the measured voltage of the electrode is less than a predetermined threshold value, supplying the voltage of the value stored in (c-1) to the electrode.

4. The plasma processing method according to claim 2, wherein (c) includes
   (c-1) measuring a voltage of the electrode when the processing with plasma is started, and storing a value of the measured voltage of the electrode, and
   (c-2) when a duration time of the processing with plasma becomes equal to or longer than a predetermined time, supplying the voltage of the value stored in (c-1) to the electrode.

5. The plasma processing method according to claim 1, wherein (c) includes
   (c-1) measuring a voltage of the electrode when the processing with plasma is started, and storing a value of the measured voltage of the electrode, and
   (c-2) measuring the voltage of the electrode during the processing with plasma, and when the measured voltage of the electrode is less than a predetermined threshold value, supplying the voltage of the value stored in (c-1) to the electrode.

6. The plasma processing method according to claim 1, wherein (c) includes
   (c-1) measuring a voltage of the electrode when the processing with plasma is started, and storing a value of the measured voltage of the electrode, and
   (c-2) when a duration time of the processing with plasma becomes equal to or longer than a predetermined time, supplying the voltage of the value stored in (c-1) to the electrode.

7. The plasma processing method according to claim 2, further comprising:
   (e) after the charge is removed from the electrode, carrying out the substrate from an inside of a processing chamber.

8. A plasma processing apparatus, comprising:
   a plasma processing chamber;
   an electrode in the plasma processing chamber;
   an electrostatic chuck in the plasma processing chamber, the electrostatic chuck adsorbing a substrate thereto by a voltage supplied to the electrode;
   a switch between the electrode and a power supply that supplies the voltage to the electrode;
   a gas supply to supply a processing gas into the plasma processing chamber;
   an RF power supply to supply an RF power into the plasma processing chamber; and
   a control circuit configured to:
      (a) control the switch to supply the voltage from the power supply to the electrode, thereby adsorbing the substrate onto an upper surface of the electrostatic chuck,
      (b) after the voltage supplied to the electrode is stabilized to reach a predetermined value, control the switch to cut off supply of the voltage from the power supply to the electrode, thereby bringing the electrode into a floating state and
      (c) after the voltage supplied to the electrode is stabilized to reach the predetermined value and the supply of the voltage to the electrode is cut off, control the RF power supply to supply the RF power into the plasma processing chamber, thereby turning the processing gas supplied into the plasma processing chamber into a plasma, and performing a predetermined processing with the plasma on a surface of the substrate adsorbed onto the electrostatic chuck in a state where the electrode is in the floating state.

* * * * *